United States Patent
Mimino et al.

(10) Patent No.: US 6,774,484 B2
(45) Date of Patent: Aug. 10, 2004

(54) HIGH FREQUENCY SEMICONDUCTOR DEVICE

(75) Inventors: Yutaka Mimino, Yamanashi (JP); Osamu Baba, Yamanashi (JP); Yoshio Aoki, Yamanashi (JP); Muneharu Gotoh, Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 10/090,610

(22) Filed: Mar. 6, 2002

(65) Prior Publication Data

US 2002/0140089 A1 Oct. 3, 2002

(30) Foreign Application Priority Data

Mar. 30, 2001 (JP) .......................................... 2001-102613

(51) Int. Cl.[7] .............................................. H01L 23/34
(52) U.S. Cl. ....................................... 257/728; 257/758
(58) Field of Search ................................ 257/728, 758

(56) References Cited

U.S. PATENT DOCUMENTS

| | | | | |
|---|---|---|---|---|
| 5,723,908 A | * | 3/1998 | Fuchida et al. | 257/758 |
| 5,789,807 A | * | 8/1998 | Correale, Jr. | 257/691 |
| 5,973,554 A | * | 10/1999 | Yamasaki et al. | 327/564 |
| 6,100,573 A | * | 8/2000 | Lu et al. | 257/508 |
| 6,326,693 B1 | * | 12/2001 | Mimoto et al. | 257/773 |
| 6,489,671 B2 | * | 12/2002 | Aoki et al. | 257/691 |

FOREIGN PATENT DOCUMENTS

| | | | |
|---|---|---|---|
| JP | 60-167445 | * | 8/1985 |
| JP | 62-22457 | | 1/1987 |
| JP | 02-296329 | | 12/1990 |
| JP | 03-77324 | * | 4/1991 |

OTHER PUBLICATIONS

Office Action dated May 13, 2003 from Japanese Patent Office in corresponding Japanese patent application and English translation.

Ali M. Niknejad and Robert G. Meyer: "Analysis, Design, and Optimization of Spiral Inductors and Transformers for Si RF IC's", IEEE Journal of Solid–State Circuits, vol. 33, No. 10, Oct. 1998.

* cited by examiner

Primary Examiner—David Nelms
Assistant Examiner—Tu-Tu Ho
(74) Attorney, Agent, or Firm—Westerman, Hattori, Daniels & Adrian, LLP

(57) ABSTRACT

A multilayer wiring structure for MMICs includes a power-supply wiring formed of a multilayer wiring (a plurality of power-supply lines). The wires are interconnected by throughholes. A power-supply current is divided and supplied to the lines. A large current can be supplied to the entirety of the multilayer wiring, even when the width of each of the lines is reduced. The multilayer wiring structure has an improved degree of freedom in the layout of wiring.

6 Claims, 14 Drawing Sheets

HIGH FREQUENCY SEMICONDUCTOR DEVICE

BACKGROUND OF THE INVENTION

1. Field of the Invention

The present invention relates to high-frequency monolithic microwave integrated circuits (MMICs), and in particular, to an MMIC which supplies a high power output.

Many high-frequency MMICs include a semiconductor chip having a transistor which needs a DC bias. To obtain large output power, a large current must be supplied to the transistor. The present invention provides a multilayer wiring structure provided on a semiconductor substrate in order to supply a DC bias to the transistor.

2. Description of the Related Art

FIGS. 1A and 1B illustrate a semiconductor device according to the related art. FIGS. 1A and 1B are cross-section and plan views of the multilayer wiring structure of the semiconductor device, respectively.

As shown in FIGS. 1A and 1B, the semiconductor device has a multilayer wiring structure in which an insulating layer 2 and multilayer wiring layers (no intermediate layer shown) are stacked on a semiconductor substrate 1. DC power is externally supplied to a power-supply pad 9 provided on the top of the multilayer wiring structure via a wire or the like. In the semiconductor device, from a power-supply line 4 which connects to the power-supply pad 9 and extends on the semiconductor substrate 1, a power-supply potential is supplied to an active region 3 formed on the semiconductor substrate 1, for example, to a transistor's drain 6 via through-holes 5.

For a high frequency MMIC, a power-supply circuit must be designed not as a simple DC-power-supply circuit but as a distributed constant circuit having low-pass-filter characteristics. Consequently, a power-supply-wiring layout has limiting conditions which are characteristic in a high frequency circuit. Accordingly, a high degree of freedom in the layout is greatly demanded.

To obtain large output power, a large current must be supplied to the transistor. Thus, a power-supply line must have a predetermined width in order to secure a current-carrying capacity. When the power-supply line does not satisfy the predetermined width, problems occur, such as a voltage drop caused by the resistance of the power-supply line, heat generated by the power-supply wiring, and migration in the power-supply wiring.

For the high frequency MMIC, the power-supply wiring is normally designed as a distributed constat circuit which does not allow a high frequency signal to pass through it. In order that the distributed constant circuit may not allow the high frequency signal to pass through it, a wiring length which is approximately a quarter of the wavelength of the signal is required. Also, when wiring lines are arranged so as to be mutually close, unexpected coupling is generated between lines, and the arrangement is not preferable for a circuit. Accordingly, the wiring must be performed so that lines are disposed at intervals. Regarding the wiring interval, in the case of a microstrip line which is commonly used in the MMIC, the microstrip line cannot fulfill its function unless the writing interval is increased to be larger than a distance up to the ground on the back of a semiconductor chip.

Therefore, to obtain high output, power-supply lines which each have a length larger than the quarter wavelength and a large width must be disposed, with a distance provided between two lines. The thus formed wide and long power-supply circuit reduces the degree of freedom in the chip layout and leads to an increase in the area of the semiconductor chip.

SUMMARY OF THE INVENTION

It is an object of the present invention to provide a multilayer wiring structure for semiconductor devices in which the degree of freedom in the layout of wiring is increased.

To this end, according to the present invention, the above object is achieved through provision of a multilayer wiring structure for semiconductor devices which includes a semiconductor substrate, at least one active region supplied with an electric power from a power-supply potential, and a plurality of power-supply lines for supplying with the electric power to said active region therethrough, which are disposed at different layers of the multilayer wiring structure on said semiconductor substrate and are connected in parallel to each other.

Preferably, a common power-supply line which is connected to the power-supply lines and which has a current-carrying capacity larger than that of each of the power-supply lines is provided between the power-supply potential and the at least one active region.

The multilayer wiring structure may further include at least one power-supply pad connecting to the power-supply potential. The common power-supply line may be provided between the power-supply pad and the power-supply lines.

The common power-supply line may be provided between the active region and the power-supply lines.

The common power-supply line may be provided between the power-supply potential and the at the active region, with both ends thereof connecting to the power-supply lines.

The power-supply lines may connect in parallel to the active regions.

The power-supply lines may connect to the power-supply potential by a plurality of power-supply pads connecting in parallel to the power-supply lines.

According to the present invention, the width of each power-supply line can be reduced, so that the area of a semiconductor chip is reduced and the degree of freedom in the layout of wiring for design of a high-frequency semiconductor device is increased. This greatly contributes to an improvement in the performance of the semiconductor device.

DESCRIPTION OF THE PREFERRED EMBODIMENTS

Figure 1A:
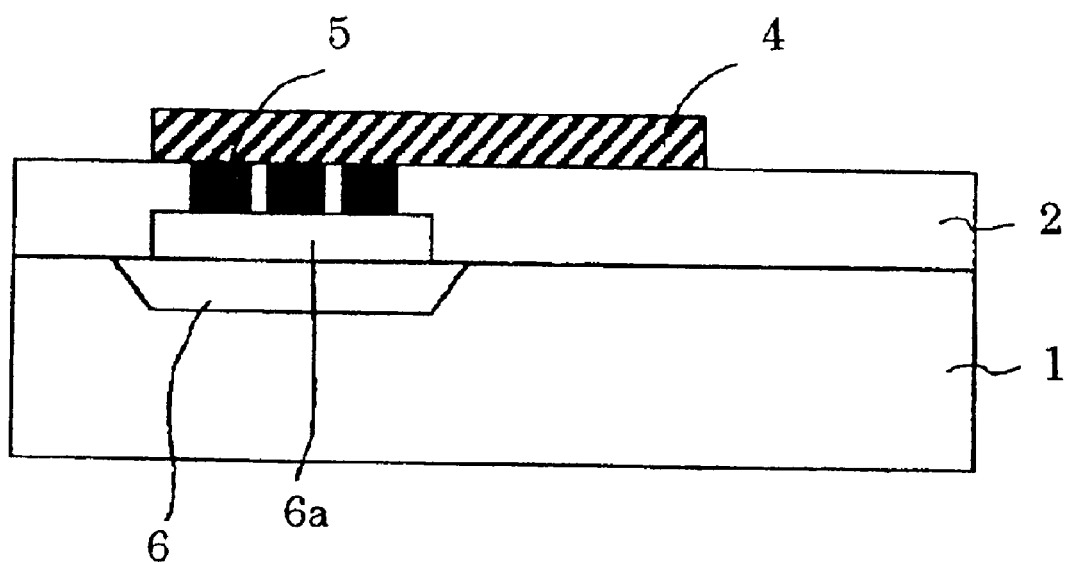
FIG. 1A is a section view of a semiconductor device according to the related art.
Figure 1B:
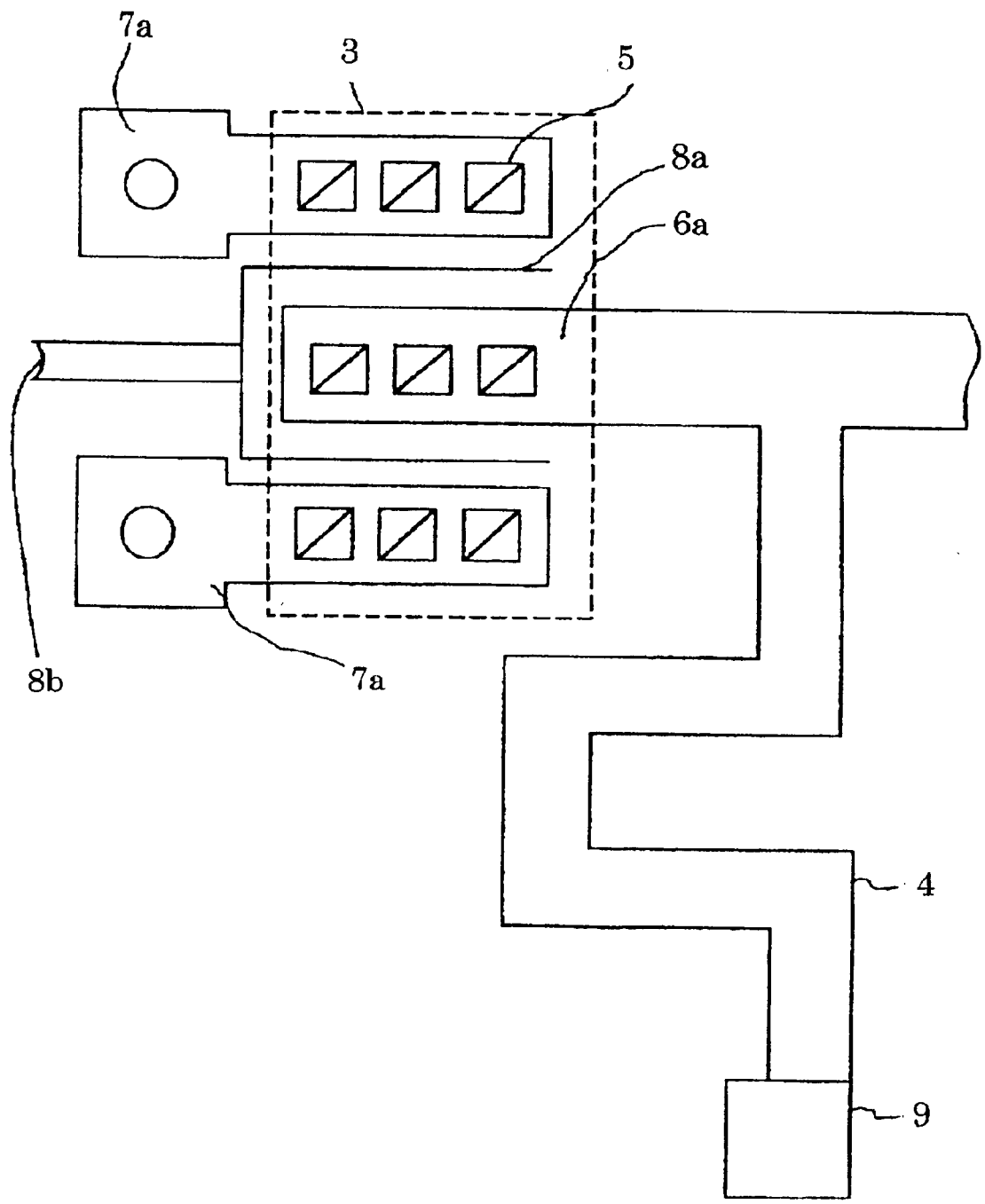
FIG. 1B is a plan view of the semiconductor device.
Figure 2A:
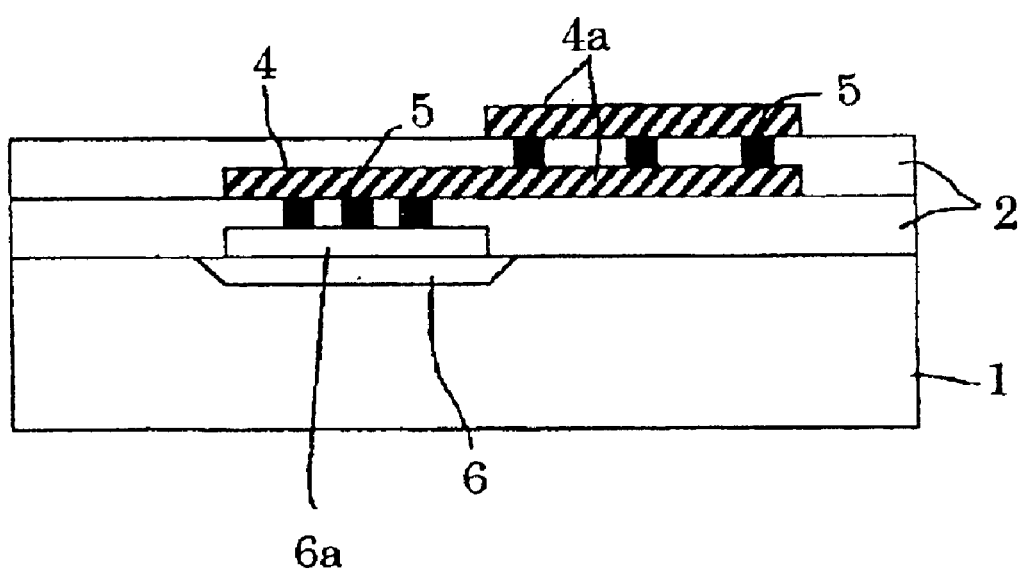
FIGS. 2A, 2B, and 2C are section views illustrating the principle of the present invention.
Figure 2B:
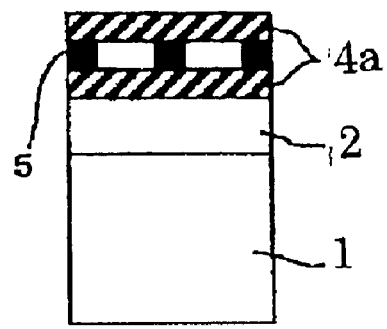
Figure 2C:
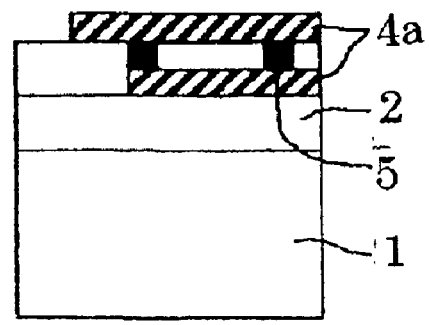
Figure 2D:
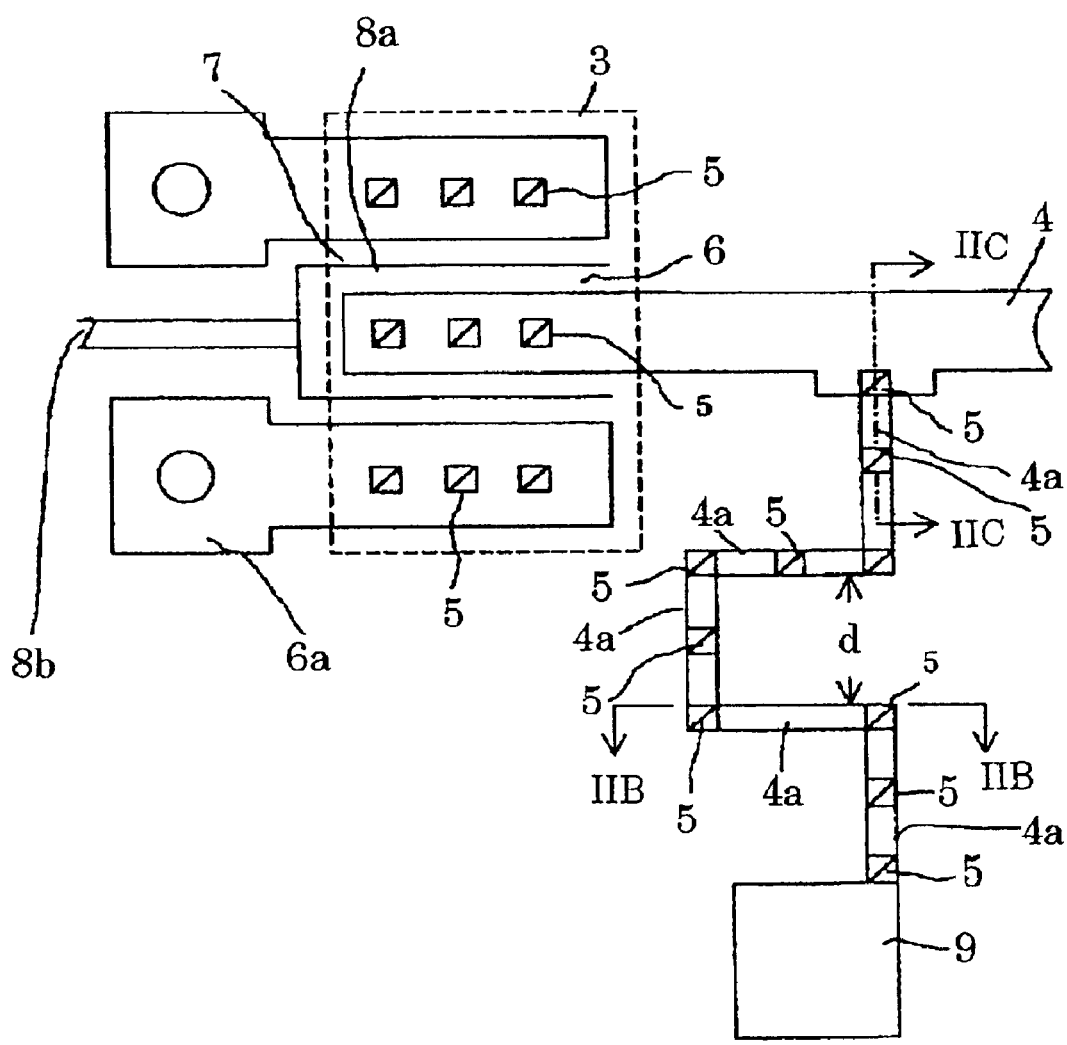
FIG. 2D is a plan view illustrating the principle of the present invention.

FIGS. 2A to 2D illustrate the principle of the present invention. FIG. 2A shows a cross-section of power-supply lines of a semiconductor device. FIG. 2D is a plan view showing the power-supply lines of the semiconductor device. FIG. 2B shows a cross-section taken along the line IIB13 IIB of FIG. 2D. FIG. 2C shows a cross-section taken along the line IIC—IIC of FIG. 2D.

In the present invention, at least part of power-supply wiring 4 for connecting a power-supply pad 9 and an active region 3 (e.g., a drain 6) is formed by a plurality of power-supply lines 4a disposed at different levels, as shown in FIGS. 2A to 2D. In other words, the power-supply lines 4a are arranged in a plurality of wiring layers. The power-supply lines 4a are interconnected by throughholes 5. In this structure, a power-supply current is divided and distributed to the power-supply lines 4a, which are wiring paths constituting multilayer wiring, and the divided currents are supplied to the active region 3. For brevity of description, the part of the power-supply wiring 4 which is formed by the power-supply lines 4a is hereinafter referred to as the "power-supply lines 4a" or simply as each "power-supply line 4a".

As described above, in the present invention, the power-supply lines 4a are arranged in the wiring layers, and the power-supply current is distributed to each wiring layer. Thus, if the width of each power-supply line 4a in each wiring layer is reduced, the entirety of the wiring layers can secure a current-carrying capacity similarly to a single large-width wiring line having a necessary current-carrying capacity. Accordingly, the width of each power-supply line 4a can be reduced to be smaller than the width of the single wiring layer. This increases the degree of freedom in the layout of wiring. Also, even if each power-supply line 4a is bent, a sufficient interline distance d can be secured since the width of each power-supply line 4a is small. This increases the degree of freedom in the layout.

In the present invention, the power-supply lines are not limited to two layers, but may be three or more layers in accordance with the current.

Modifications of the present invention are described below.

First Type of Modifications

Figure 3:
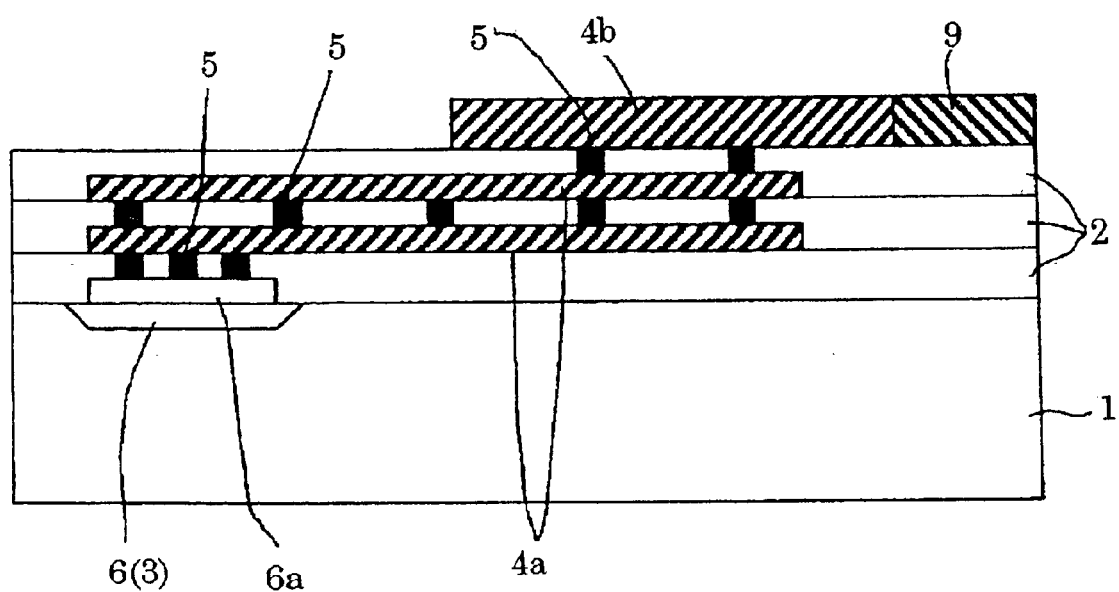
FIG. 3 is a section view of a first modification of the present invention.

FIG. 3 is a sectional view showing a first modification of the present invention, and shows a multilayer wiring structure. As shown in FIG. 3, in the first modification of the present invention, a portion of the above power-supply lines 4a is integrated with a common power-supply line 4b which has a larger thickness. The integration means that currents which flow in the power-supply lines 4a are merged to flow into the common power-supply line 4b, or conversely means that a current in the common power-supply line 4b is divided to flow in the power-supply lines 4a. The common power-supply line 4b in the first modification is thicker than the power-supply lines 4a. Thus, the common powersupply line 4b has a current-carrying capacity larger than that of each line forming the power-supply lines 4a which has a width identical to that of the common power-supply line 4b.

The division of the power-supply wiring 4 into the power-supply lines 4a in the present invention leads to an increased number of wiring lines. Accordingly, in a region having a enough room for a high-frequency-circuit-wiring layout, by integrating the power-supply lines 4a with the common power-supply line 4b, the number of lines constituting the power-supply wiring 4 can be reduced, so that an effective wiring layout is realized.

Figure 4:
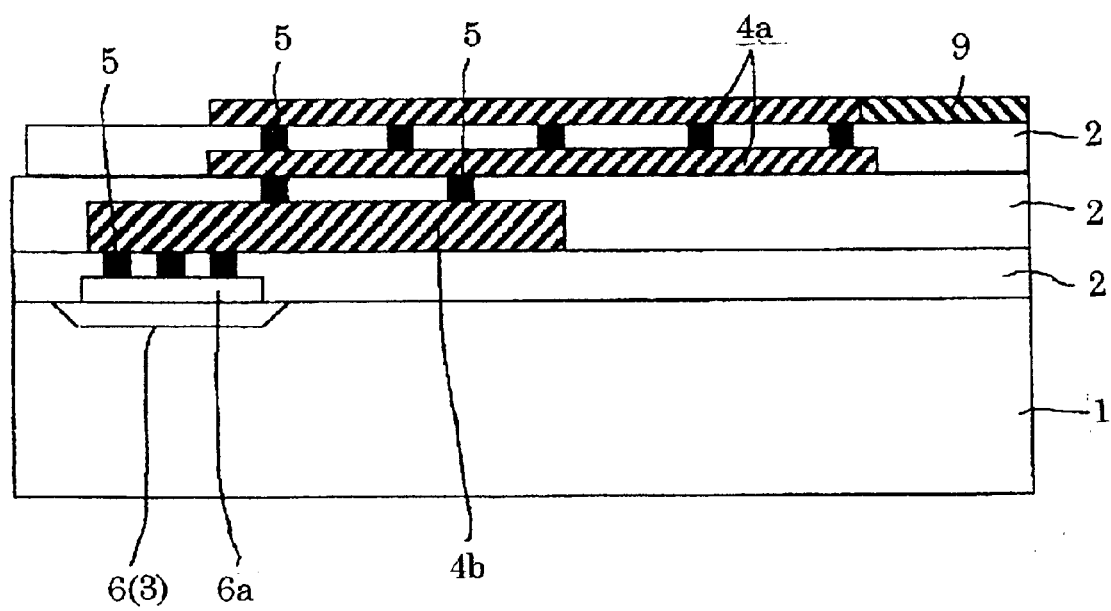
FIG. 4 is a section view of a second modification of the present invention.
Figure 5:
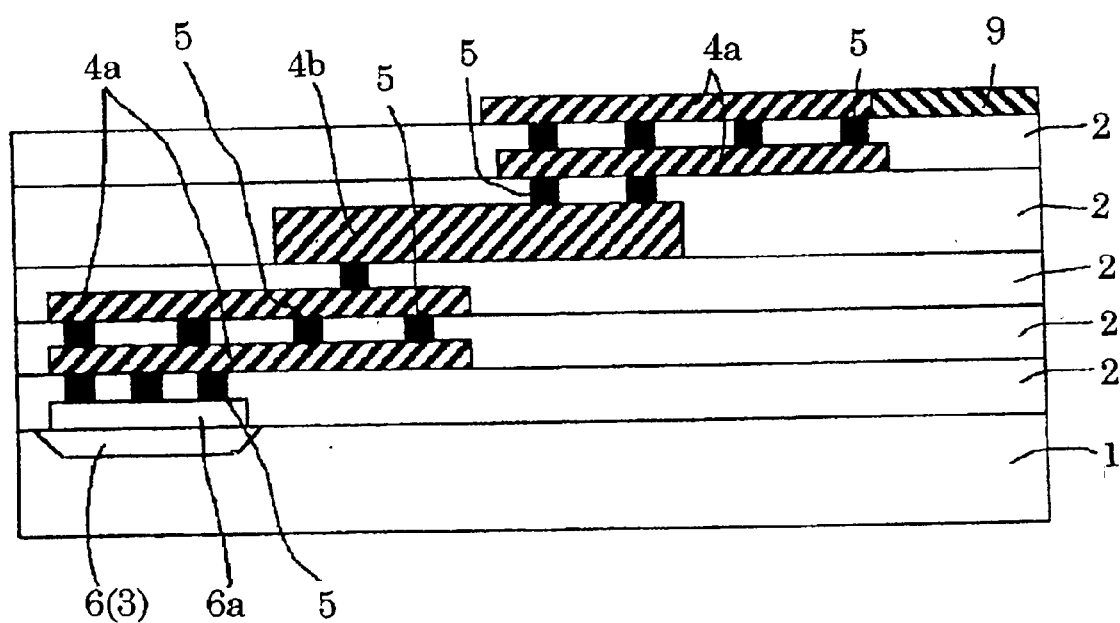
FIG. 5 is a section view of a third modification of the present invention.

FIG. 4 is a sectional view showing a second modification of the present invention. FIG. 5 is a sectional view shown a third modification of the present invention. Both show multilayer wiring structures.

As can be seen in FIG. 3, the above common power-supply line 4b, which has a thick wiring layer, can be used for a portion which directly connects to the power-supply pad 9 connected to a power-supply potential. As can be seen in FIG. 4, the above common power-supply line 4b can also be used as a portion of the power-supply wiring 4 which connects to the active region 3 (e.g., the drain 6). As can be seen in FIG. 5, the common power-supply line 4b can also be used as a portion for connecting two pairs of power-supply lines 4a which are separately provided, that is, as the intermediate portion of the power-supply lines 4a.

Second Type of Modification

Figure 6A:
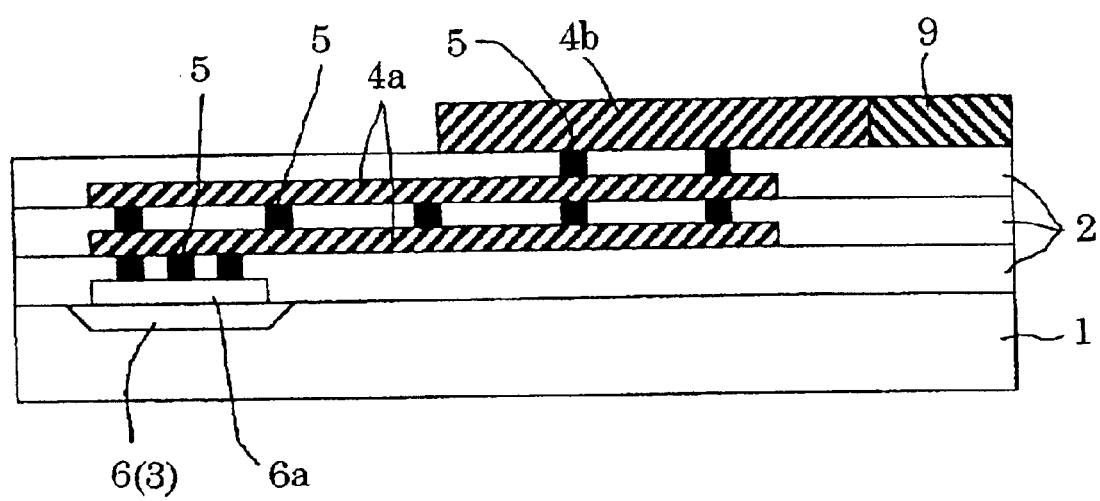
FIG. 6A is a section view of a fourth modification of the present invention.
Figure 6B:
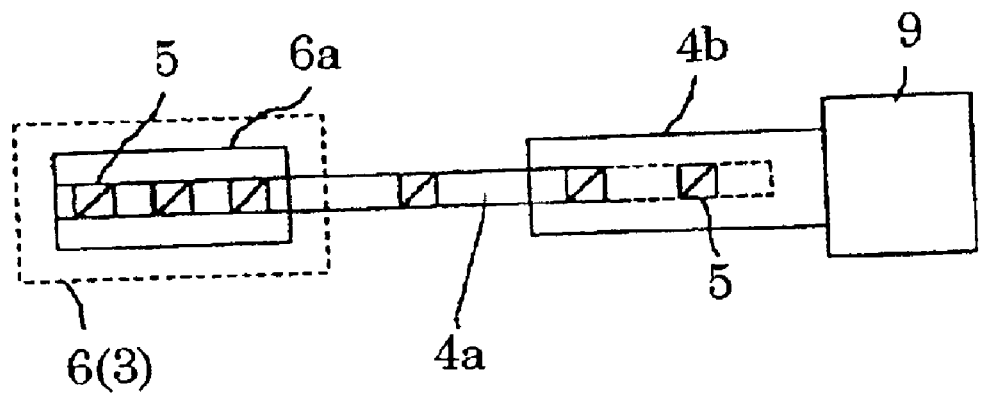
FIG. 6B is a plan view of the fourth modification.

FIGS. 6A and 6B illustrate a fourth modification of the present invention, and show a multilayer wiring structure. FIG. 6A is a sectional view, and FIG. 6B is a plan view. In the fourth modification, a portion of the above power-supply lines 4a is integrated with the common power-supply line 4b which has a large width, as shown in FIGS. 6A and 6B. In other words, the fourth modification is a form obtained by replacing the common power-supply line 4b in the first modification by a wiring line having a larger width.

In the fourth modification, in a region having a enough room for a high-frequency-circuit-wiring layout, the power-supply wiring 4 can be integrated with at least one common power-supply line 4b having a large width. Thus, similarly to the first modification, an effective wiring layout is realized. In this case, by disposing the common power-supply line 4b in the region having a enough room for a high-frequency-circuit-wiring layout, an increase of layout limitations or enlargement of the area of the semiconductor chip can be avoided. In addition, because the thickness of the common power-supply line 4b is set identically to the thickness of another wiring line, the common power-supply line 4b can be formed simultaneously with the other wiring lines.

Similarly to the first, second, and third modifications, a location at which the common power-supply line 4b in the fourth modification is disposed is one of the portion which connects to the power-supply pad 9, the intermediate portion of the divided power-supply lines 4a, the portion of the power-supply wiring 4 which is connected to the active region 3, etc.

Third Type of Modification

Figure 7:
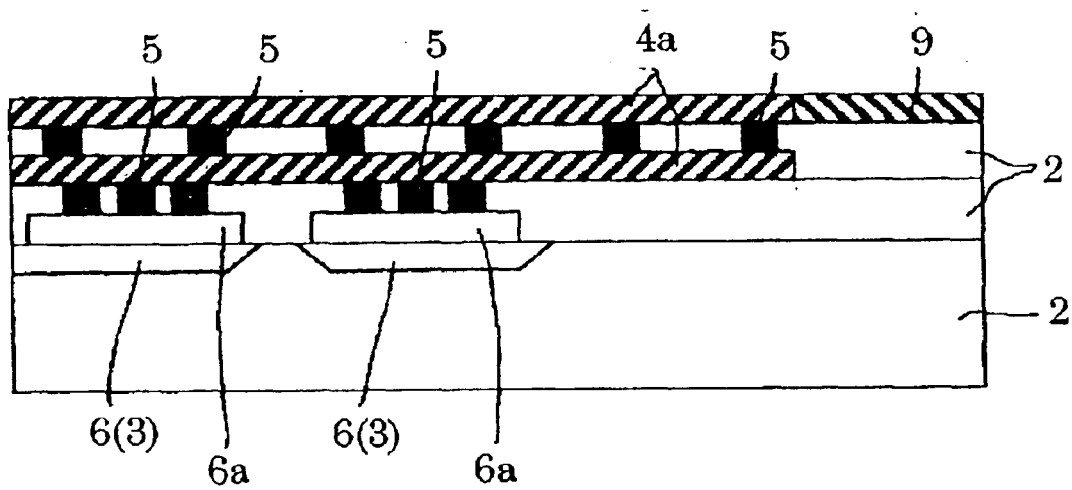
FIG. 7 is a section view of a fifth modification of the present invention.

FIG. 7 is a sectional view showing a fifth modification of the present invention, and shows a multilayer wiring structure. In the fifth modification, the above power-supply lines 4a according to the present invention connect to a plurality of active regions 3 (e.g., drains 6), and function as a power-supply bus for supplying power to the active regions 3.

According to the fifth modification, power supply is performed by the power-supply lines 4. Thus, the powersupply lines 4 naturally have a large current-carrying capacity compared with a power-supply line having an identical width. Therefore, it is possible that, by using the power-supply lines 4 as a power-supply bus, the power-supply lines 4 be used as power-supply lines common to the active regions 3. Also in this structure, the degree of freedom in the high-frequency-circuit-wiring layout can be increased because narrow wiring lines are used to form a layout of power-supply wiring, as described above.

Fourth Type of Modification

Figure 8:
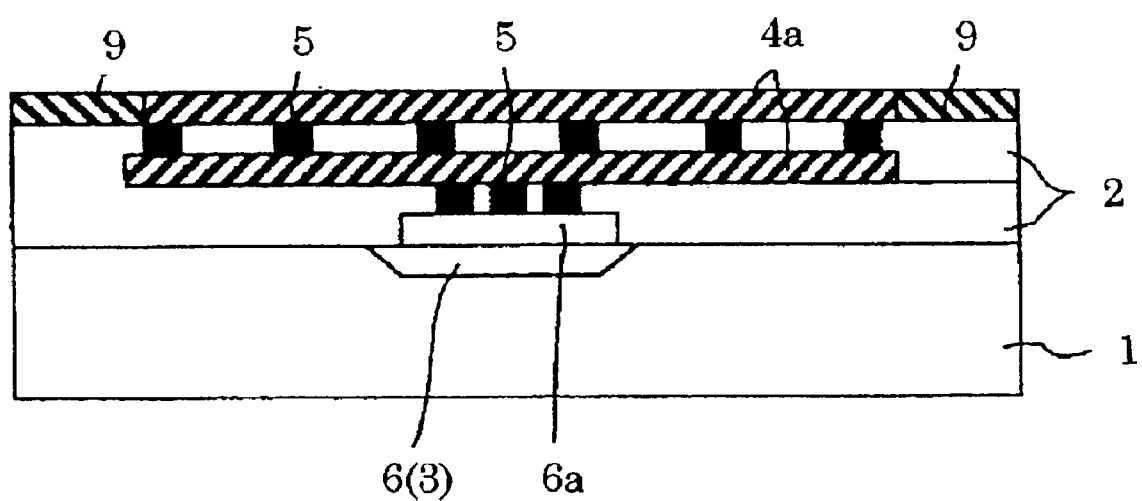
FIG. 8 is a section view of a sixth modification of the present invention.

FIG. 8 is a sectional view showing a sixth modification of the present invention, and shows a multilayer wiring structure. As can be seen in FIG. 8, the above power-supply lines 4a are connected to a plurality of power-supply pads 9.

In the sixth modification, the power-supply pads 9 are supplied with power, and the power is supplied through a plurality of power-supply paths to an active region 3. Accordingly, when a large amount of power must be supplied, the amount of power can be easily supplied by performing power supply from the power-supply pads 9, which have identical potentials.

First Embodiment

Figure 9:
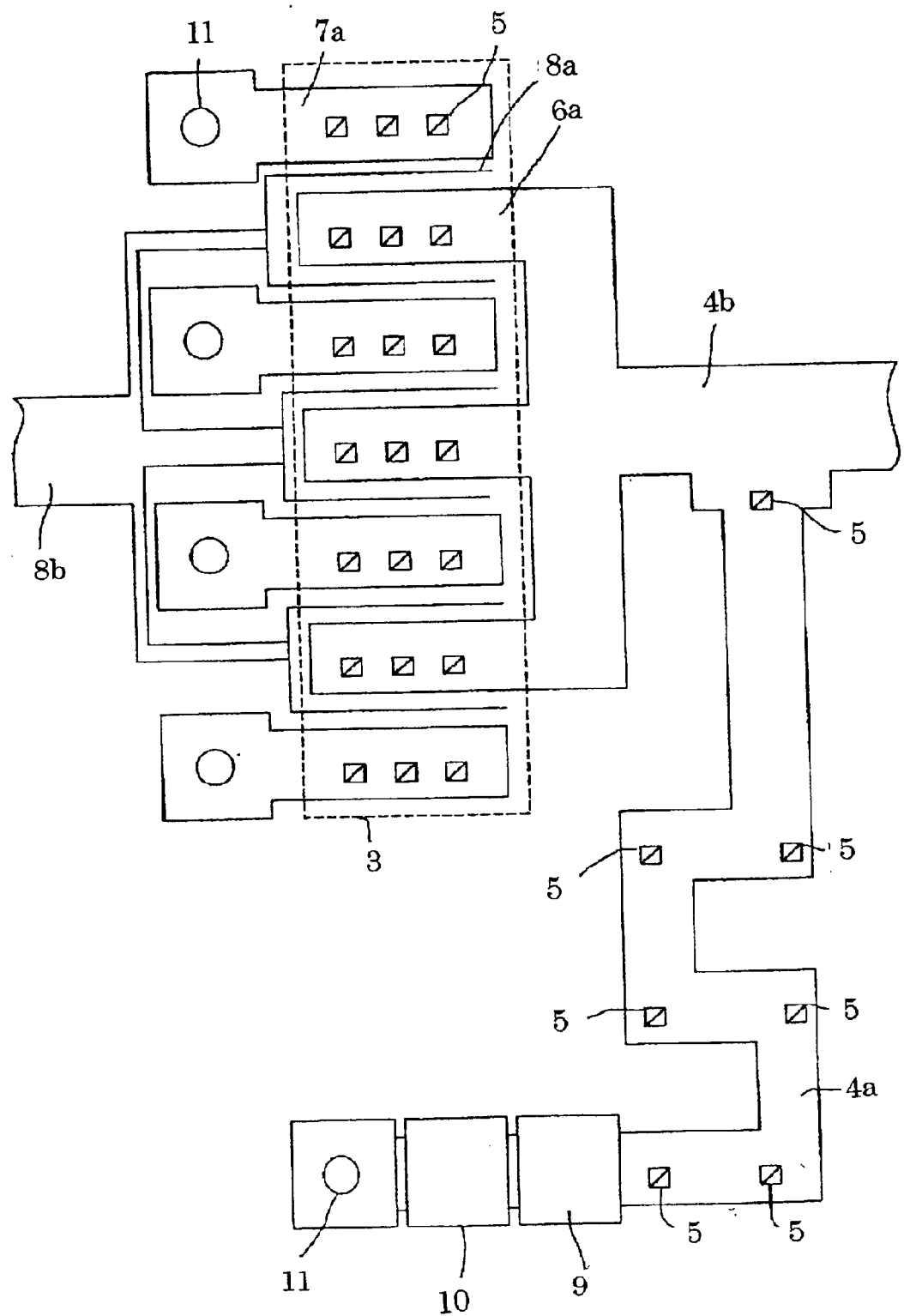
FIG. 9 is a plan view of a first embodiment of the present invention.

FIG. 9 is a plan view showing a first embodiment of the present invention, and shows an MMIC wiring pattern. In the first embodiment, a high-output high-frequency transistor is formed in which an active region 3 including a drain and a source is formed on the surface of a semiconductor substrate and in which comb shaped gate electrodes 8a, source electrodes 7a, and drain electrodes 6a are provided on the active region 3.

A power-supply pad 9 is provided on the top wiring, layer on the semiconductor surface. The power-supply pad 9; is grounded to a viahole 11 via a capacitor 10, and is short-circuited to the ground potential in a high frequency range. A power-supply current supplied to the power-supply pad 9 flows in meandering power-supply lines 4a. The current is supplied as a DC bias to the drain of the high-frequency transistor after flowing from a wide common power-supply line 4b to throughholes 5 and the drain electrodes 6a. The meandering power-supply lines 4a have a quarter of the wavelength of an operating frequency signal on the substrate, and function as a low-pass filter.

In the first embodiment, the width of the power-supply lines 4a constituting the filter can be narrowed than a single power-supply line according to the related art. Accordingly, even if the power-supply lines 4a are arranged so as to be bent, the distance between power-supply lines 4a and the distance from the power-supply lines 4a to a signal line (high-frequency-circuit line) can be secured. Thus, the degree of freedom in the layout can be increased.

Second Embodiment

Figure 10:
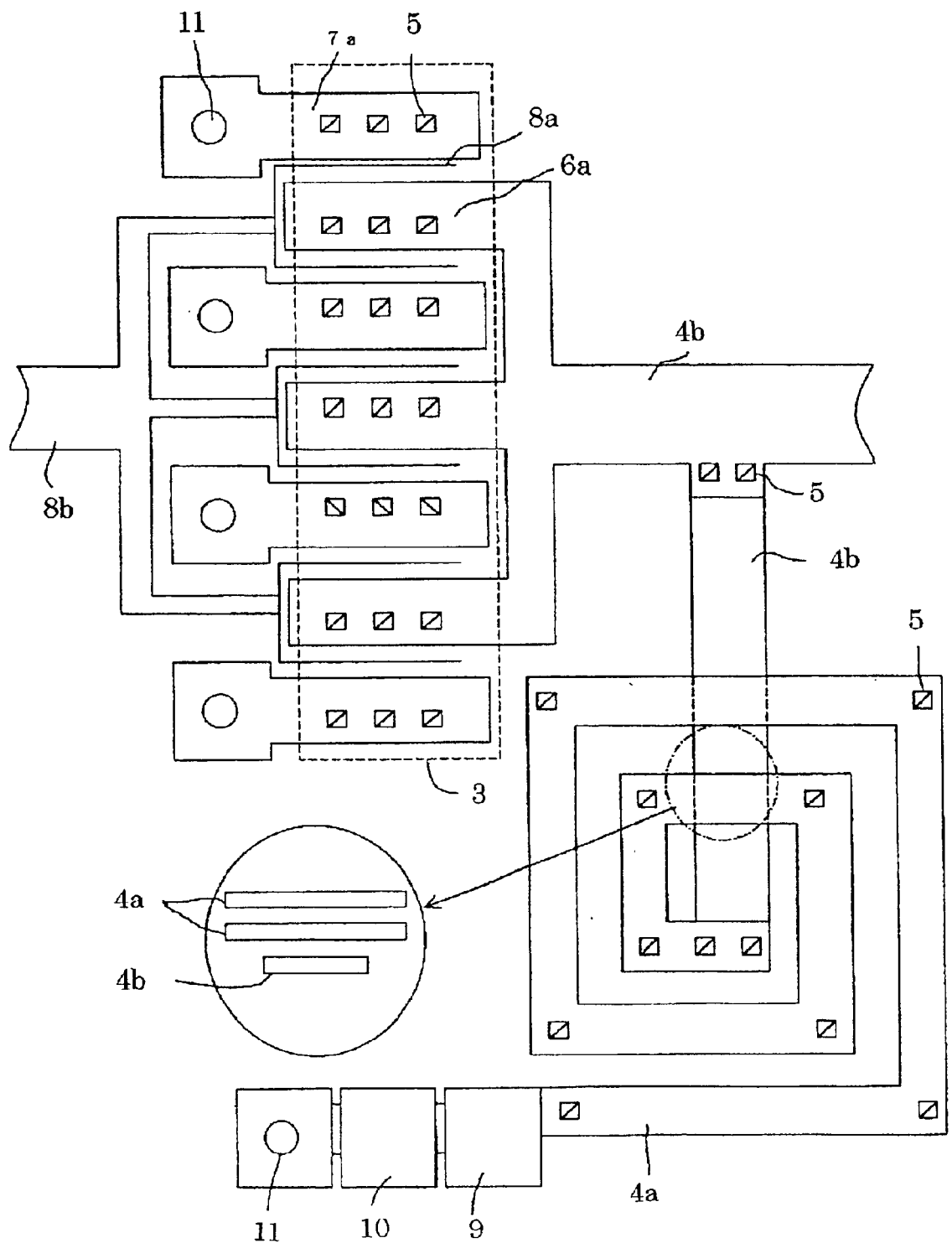
FIG. 10 is a plan view of a second embodiment of the present invention.

FIG. 10 is a plan view showing a second embodiment of the present invention, and shows an MMIC wiring pattern. In the second embodiment, the power-supply lines 4a in the first embodiment is formed as a spiral pattern, as shown in FIG. 10. In other words, a plurality of power-supply lines 4a for connecting a power-supply pad 9 and a common power-supply line 4b are spirally disposed. The larger circle shown in FIG. 10 is a partially sectional view and shows a vertical relationship between the common power-supply line 4b and the power-supply lines 4a. The partially sectional view shows that the spiral power-supply lines 4a consist of two layers over the common power-supply line 4b, which is wide. The two layers are interconnected by throughholes 5. Central ends of the spiral power-supply lines 4a are connected by the throughholes 5 to the common power-supply line 4b at a lower level and are electrically connected to part of the common power-supply line 4b which is outside the spiral. As described above, by spirally disposing the power-supply lines 4a, their inductance component can be increased. This makes it possible to make a broad band bias circuit.

What is claimed is:

1. A multilayer wiring structure for semiconductor devices, comprising:

a semiconductor substrate;

at least one active region supplied with an electric power from a power-supply potential;

a plurality of power-supply lines for supplying the electric power to said active region therethrough, said power-supply lines disposed at different layers of the multilayer wiring structure on said semiconductor substrate and being connected in parallel to each other; and a common power-supply line provided between said power-supply potential and said active region, the common power-supply line being connected to the power-supply lines and having a current-carrying capacity larger than that of each of the power-supply lines, wherein said common power-supply line is provided between said active region and said power-supply lines.

2. A multilayer wiring structure for semiconductor devices, comprising:

a semiconductor substrate;

at least one active region supplied with an electric power from a power-supply potential;

a plurality of power-supply lines for supplying the electric power to said active region therethrough, said power-supply lines disposed at different layers of the multilayer wiring structure on said semiconductor substrate and being connected in parallel to each other; and a common power-supply line provided between said power-supply potential and said active region, the common power-supply line being connected to the power-supply lines and having a current-carrying capacity larger than that of each of the power-supply lines, wherein said common power-supply line is provided between said power-supply potential and said active region, with both ends thereof connecting to the power-supply lines.

3. A multilayer wiring structure for semiconductor devices, according to claim 1, wherein said power-supply lines connect in parallel to the active regions.

4. A multilayer wiring structure for semiconductor devices, according to claim 1, wherein said power-supply lines connect to said power-supply potential by a plurality of power-supply pads connecting in parallel to said power-supply lines.

5. A multilayer wiring structure for semiconductor devices, according to claim 2, wherein said power-supply lines connect in parallel to the active regions.

6. A multilayer wiring structure for semiconductor devices, according to claim 2, wherein said power-supply lines connect to said power-supply potential by a plurality of power-supply pads connecting in parallel to said power-supply lines.

* * * * *